United States Patent [19]
Nishikubo et al.
[11] 3,923,523
[45] Dec. 2, 1975

[54] PHOTOCURABLE COMPOSITION AND A METHOD OF PREPARING SAME

[75] Inventors: Tadatomi Nishikubo; Masahiko Kishida; Masakazu Imaura, all of Fujisawa, Japan

[73] Assignee: Nippon Oil Seal Industry Co., Ltd., Tokyo, Japan

[22] Filed: Sept. 26, 1973

[21] Appl. No.: 400,814

[30] Foreign Application Priority Data

Sept. 29, 1972 Japan ................................ 47-97203

[52] U.S. Cl. .............. 96/115 P; 96/35.1; 96/115 R; 204/159.15; 204/159.19; 260/75 UA; 427/43; 427/44

[51] Int. Cl.$^2$ ........................ G03C 1/68; G03C 1/70

[58] Field of Search ........................ 96/115 R, 115 P; 204/159.19, 159.15

[56] References Cited

UNITED STATES PATENTS

| | | | |
|---|---|---|---|
| 3,485,733 | 12/1969 | D'Alelio | 204/159.15 |
| 3,639,321 | 2/1972 | Fuhr et al. | 260/28.5 |
| 3,695,877 | 10/1972 | Taneda et al. | 96/115 R |

*Primary Examiner*—Ronald H. Smith
*Attorney, Agent, or Firm*—Holman & Stern

[57] ABSTRACT

A photocurable composition and method of making same are disclosed. The composition includes the polyester obtained from a poly-ol having a photopolymerizable $\alpha$, $\beta$-unsaturated ester group and a polycarboxylic acid anhydride such as pyromellitic acid dianhydride, along with a photopolymerization initiator and, optionally, a photopolymerizable monomer.

5 Claims, No Drawings

PHOTOCURABLE COMPOSITION AND A METHOD OF PREPARING SAME

BACKGROUND AND SUMMARY OF THE INVENTION

The present invention relates to a photocurable composition and to a method of producing same and, more particularly, to a photocurable composition including a polyester or derivative thereof, a photopolymerization initiator, and, optionally, a photopolymerizable monomer, as well as a method of producing the composition.

It has been found in the past that an unsaturated polyester obtained from the combination of a dicarboxylic acid such as maleic acid or fumaric acid, or a dicarboxylic acid anhydride such as maleic acid anhydride, and a poly-ol does not provide a good photocurable composition so that, in general, a substantial photocure of such composition is normally carried out by adding a photopolymerizable monomer, such as styrene, and a photopolymerization initiator to the polyester. However, the curing speed of the photocurable composition which includes styrene as an ingredient thereof is rather low, so that the polymerization speed of styrene as a photopolymerizable monomer is also low.

Thus, it is not advantageous to use such compositions in photocurable materials such as adhesives, paints, varnishes and printing inks, which require a high speed cure. In general, there are employed as photopolymerizable monomers in such photocurable compositions, acrylates or methacrylates, especially polyfunctional acrylates, and polyfunctional allyl monomers, these materials being preferred in view of their crosslinking speed and boiling point. However, the crosslinking reaction speed of the previously mentioned unsaturated polyesters, when using these esters as a photopolymerizable monomer, is lower than in the case where styrene is employed as a photopolymerizable monomer, due to a different monomer reactivity ratio between the unsaturated polyester and these esters. Therefore, the crosslinking density of the composition is low, i.e., the cure speed is low. Further, when a photopolymerization initiator is added to other unsaturated polyesters known in the market, their curing speed is relative low.

An object of the present invention is to provide a photocurable composition which overcomes these disadvantages in the prior art, and particularly, the object of the present invention is to provide a photocurable composition in which acrylic acid or methacrylic acid can be effectively used as a photopolymerizable monomer.

This object of the present invention is attained by using, as a main curing ingredient of a photocurable composition, the polyester obtained from a poly-ol having a photopolymerizable group and poly-carboxylic acid anhydride such as pyromellitic acid dianhydride, benzophenone tetra-carboxylic acid dianhydride, methylene glycol bistrimellitate, etc., particularly, pyromellitic acid dianhydride. Another object of the present invention is to provide a photocurable composition which is used effectively for PS plate and the like, without a photopolymerizable monomer. Thus this invention relates to a photocurable composition which includes the polyester obtained from a poly-ol having a photopolymerizable $\alpha,\beta$-unsaturated ester group and pyromellitic acid dianhydride, a photopolymerization initiator, and, optionally, a photopolymerizable monomer. The composition is preferably obtained by reacting a poly-ol having a photopolymerizable $\alpha,\beta$-unsaturated ester group with pyromellitic acid dianhydride in a photopolymerizable monomer, and adding a photopolymerization initiator to the obtained polyester solution.

DESCRIPTION OF THE PREFERRED EMBODIMENTS

The poly-ols having a photopolymerizable $\alpha,\beta$-unsaturated ester group which are employed in the present invention are polyols having at least two hydroxy groups and a photopolymerizable $\alpha,\beta$-unsaturated carboxylic acid ester group such as acrylate, methacrylate, chrotonate, sorbate, cinnamate group, etc. Examples of such poly-ols include trimethylolpropane monoacrylate, glyceryl monoacrylate, pentaerythritol diacrylate, the reaction product of polyethylene glycol diglycidylether and acrylic acid (molar ratio 1 : 2), the reaction product of polypropyleneglycol diglycidylether and acrylic acid (molar ratio 1 : 2), the reaction product of neopentylglycol diglycidylether and acrylic acid (molar ratio 1: 2), the reaction product of bisphenol-A diglycidylether and acrylic acid (molar ratio 1 : 2), and corresponding diols of methacrylate, chrotonate, etc.

The characteristics of the polyesters obtained from these poly-ols and pyromellitic acid dianhydride may be controlled by various factors. For example, the degree of polymerization of the polyesters may be controlled by varying the molar ratio of poly-ol to pyromellitic acid dianhydride and by adding an alcohol such as methanol, ethanol and a polyester including a monohydroxy group, such as 2-hydroxyethyl acrylate or 2-hydroyxpropyl acrylate, to the polymerization system. Control of the melting point and the crosslinking density of the polyester can be achieved by adding other kinds of poly-ols such as ethyleneglycol, polyethyleneglycol, resorcin, hydroquinone, bisphenol-A, etc., to the polymerization system. Further, by using a di-ol having an inner double bond, such as the eleostearate group, as the above mentioned other poly-ol, the cure of the composition-surface in contact with air is improved. One excellent characteristic of the present invention is that the polyester obtained from pyromellitic acid dianhydride and a poly-ol having a photopolymerizable $\alpha,\beta$-unsaturated ester group has a free carboxylic group in the side chain. The existence of the free carboxyl group is highly effective in preventing the dark reaction of the photocurable composition, the stability of the composition being a very important matter from the viewpoint of industry.

The addition polymerization reaction of the poly-ol and pyromellitic acid dianhydride is generally carried out at room temperature. When it is necessary to enhance the reaction rate, the temperature is raised. Various photopolymerizable monomers can be used as a reaction solvent and these photopolymerizable monomers are not concerned with the polymerization reaction directly, but act only as a reaction solvent.

The obtained polyester solution may be used as a photocurable composition by adding a photopolymerization initiator to the solution, and the photopolymerizable monomer in the composition accordingly to the present invention is also quickly cured by exposure to the light. Solvent evaporation does not occur during photocure of the composition. Therefore, it is highly desirable that acrylate or methacrylate having a high curing speed is used as a photopolymerization monomer. When these esters are used as an ingredient of the photocurable composition according to the present invention, the curing speed of the photocurable composition is high enough so that the advantageous characteristics of these esters are imparted to the composition.

This reaction is generally carried out in an atmosphere of air and, when acrylate or methacrylate is used as the reaction solvent, the inhibiting effect on thermal polymerization by the influence of oxygen is greater than in the case where a solvent such as stylene is employed. Therefore, it is preferable to use acrylate or methacrylate as the reaction solvent from the viewpoint of reactivity. For examples of these esters, alkylacrylates, mono- or poly-ethyleneglycol diacrylate, propyleneglycol diacrylate, trimethylolpropane triacrylate and corresponding methacrylate may be employed. As photopolymerizable monomer other than acrylates or methacrylates, there may be employed dialkyl maleate, alkylchrotonate, dialkylitaconate, alkylsorbate, diallyl-maleate, diallylphthalate, stylene, divinylbenzene, vinylacetate, N-vinyl-pyrrolidone, n-butoxymethylol acrylamide and triallylisocyanulate. As the curing speed of styrene is comparatively low, the desirable curing speed can be obtained by mixing styrene and acrylate or methacrylate in suitable ratio.

The preparation of the photocurable composition is carried out by adding the photopolymerization initiator to the polyester and the photopolymerizable monomer. As a photopolymerization initiator, 2-alkylanthraquinone, benzoin, benzoinether, benzointhioether, decylchloride, benzoinether-Michler's ketone, N,N-dialkylaniline alkylhalide, benzoinether-thio Michler's ketone are used independently or in combination. These photopolymerization initiators are added in amounts of from 0.01 to 5% by weight of the curable ingredients of the photocurable composition. When coloring agents are added, the amount of the initiator is optionally increased. The photocurable compositions of the present invention are extremely stable in the presence of a photopolymerization initiator. The stability will vary, depending on the particular curable ingredients, but the compositions are stable at room temperature under shielding from light for several months.

In these photocurable compositions, depending upon the kind and combination of the polyester used as a curable ingredient and also upon the particular photopolymerizable monomer, the composition sometimes forms a heterogeneous or opaque viscous solution without completely dissolving the polyester. When such a photocurable composition is exposed to the light, it is cured but is not given a homogeneous cure. In these cases, the polyester in such a composition is reacted with glycidyl acrylate or glycidyl methacrylate by the free carboxyl groups in the side chain of the polyester, with the result that the reaction product forms a homogeneous viscous solution. This reaction product may be used as the main curable ingredient of the photocurable composition.

The above mentioned reaction is obtained by adding glycidyl acrylate or glycidal methacrylate to the reaction system comprising a poly-ol having a photopolymerizable $\alpha,\beta$-unsaturated ester group and pyromellitic acid dianhydride during the reaction. The degree of esterification can be controlled by controlling the molar ratio of the glycidyl compound which is added. Even a photocurable composition having a low viscosity can be sufficiently used so that the number of the crosslinking points are increased by introducing the new acrylate or methacrylate group to the side chain of the polyester, and the curing speed is thereby enhanced.

The water-soluble polyester can be obtained through preparation of a quaternary ammonium salt of the free carboxyl groups in the side chains of the polyester by reacting the free carboxyl groups in the side chains of the polyester with ammonia or triamine, or by the preparation of an alkali metal salt of the free carboxyl groups in the side chains by known methods. These polyesters can also be used as the main curable ingredient of the photocurable composition. The derivative of a quaternary ammonium salt or an alkali metal salt can be easily obtained by adding ammonia, a triamine or hydroxide of an alkali metal to the reaction system comprising the poly-ol having a photopolymerizable $\alpha,\beta$-unsaturated ester group and pyromellitic acid dianhydride. As a triamine, there may be triethylamine, trimethylamine, triethanolamine, N,N-dimethylaniline, pyridine, 2-vinylpyridine, 2-N,N-dimethylamino ethylacrylate, 2- or 3-N,N-dimethylamino propylmethacrylate and similar compounds. It is preferred that the photopolymerizable monomer is water-soluble so that the derivative of a quaternary ammonium salt or the alkali metal salt of the obtained polyester is water-soluble. In this regard, as a photopolymerizable monomer, N-vinylpyrrolidone, methoxymethylol acrylamide, 2-vinylpyridine and similar compounds may be employed. As the photocurable composition is prepared by adding a photopolymerization initiator to the derivatives of a quaternary ammonium salt or the alkali metal salt of these polyesters and the photopolymerizable monomer, it is preferred that the photopolymerization initiator is also water-soluble. However, benzoinethylether and benzoinbutylether, which are insoluble in water, can also be used as the photopolymerization initiator.

The photocurable composition according to the present invention can be effectively used in paints, varnishes and printing links, due to its high curing speed. The derivative of a quaternary ammonium salt of the polyester or the aqueous photocurable composition including alkaline metal salt may also be used as water-soluble paints and varnishes. Curing is carried out by exposure to the light, generally to ultra-violet rays, electron rays, radiation, etc., and even in the case of adding a coloring agent which delays the cure to the composition, curing is complete in less than 1 sec.

The polyester used in the present invention can also be used as a photosensitive resin, such as in PS plates, in the form of a solution in which the polyester of from about 10 to 50 weight % is dissolved in an organic solvent. In this case, development is possible not only by an organic solvent but also in an alkaline aqueous solution. Thus the photosensitive resin including the polyester in the present invention has a useful characteristic which can not be found in the photosensitive resin of the photocrosslinking type obtained by the prior arts.

A thermal polymerization inhibitor is used in an amount of from 0.01 – 5% by weight of the resulting composition to inhibit the thermal polymerization and to enhance the stability. The wave length of the light used for exposure is from 200 to 1,000 A. Wave lengths of from 200 to 500 A are particularly effective for the photocure.

The present invention is further illustrated by the following examples:

EXAMPLE 1

43.4 g. (0.1 mole) of the reaction product of neopentyl glycol diglycidylether and acrylic acid (molar ratio 1 : 2) was dissolved in 70 g. of N-vinylpyrrolidone, and 21.8 g. (0.1 mole) of pyromellitic acid dianhydride was added to the solution with agitation. Then the mixture was reacted at room temperature for 24 hours. A polyester solution having a viscosity of 13,200 poise at 25°C was obtained.

The photocurable composition was prepared by adding 37.8 parts (by weight of the composition) of trimethylolpropane triacrylate, 2 parts of benzoinmethylether, and 0.2 part of hydroquinone monomethylether to 60 parts of the obtained polyester solution. The composition was coated on a tin plate to give a film of a thickness of 0.1 mm., and was exposed to a 500 W high pressure mercury lamp from a distance of 30 cm. The required curing time was 0.3 second.

EXAMPLE 2

46.2 g. (0.1 mole) of the reaction product of neopentylglycol diglycidyl ether and methacrylic acid (molar ratio 1 : 2) was dissolved in 100 g. of N-vinylpyrrolidone, and 0.2 g. of hydroquinone monoethylether was added to the solution, and 19.6 g. (0.09 mole) of pyromellitic acid dianhydride was added to the solution with agitation. Then the mixuure was reacted at room temperature for 24 hours. A polyester solution having a viscosity of 5,300 poise at 25°C was obtained.

The photocurable composition was prepared by adding 28 parts of ethylene glycol diacrylate and 2 parts of benzoinethylether to 70 parts of the obtained polyester solution, with curing carried out in the same manner as described in Example 1. The required curing time was 0.4 second.

EXAMPLE 3

In the similar reaction as described in Example 2, a polyester solution having a viscosity of 5,350 poise at 25°C was obtained by using 46.2 g. (0.1 mole) of the reaction product of neopentyl glycol diglycidylether and chrotonic acid in place of the reaction product of neopentyl glycol diglycidylether and methacrylic acid.

The photocurable composition was prepared by adding 28 parts of trimethylol propane trimethacrylate, and 2 parts of benzoin isobutylether to 70 parts of the obtained polyester solution, with curing carried out in the same manner as described in Example 1. The required curing time was 0.5 second.

EXAMPLE 4

43.4 g. (0.1 mole) of the reaction product of neopentylglycol diglycidylether and acrylic acid (molar ratio 1 : 2), 17.4 g. (0.08 mole) of pyromellitic acid dianhydride and 0.2 g. of hydroquinone monomethylether were added to 100 g. of trimethylolpropane triacrylate. Then the mixture was reacted at room temperature for 25 hours. The reaction system was heterogeneous at the beginning, but became homogeneous as the reaction proceeded. A polyester solution having a viscosity of 380 poise at 25°C was obtained.

The photocurable composition was prepared by adding 2 parts of benzoinethyl-ether to 98 parts of the polyester solution, and was cured in the same manner as described in Example 1. The required curing time was 0.3 second.

EXAMPLE 5

8.96 g. (0.07 mole) of glycidylacrylate, 0.2 g. of methyltriethylammonium iodide, and 50 g. of trimethylolpropane triacrylate were added to 8.06 g. of the polyester solution obtained in the same manner as described in Example 4. The mixture was reacted at from 100° to 110°C for 2 hours. A reaction product solution having a viscosity of 145 poise at 25°C was obtained.

The photocurable composition was prepared by adding 2 parts of benzoinethylether to 98 parts of the obtained reaction product solution, with curing in the same manner as described in Example 1. The required curing time was 0.2 second.

EXAMPLE 6

In the similar reaction as described in Example 5, 9.9 g. of glycidyl methacrylate in place of glycidyl acrylate was used, and a reaction product solution having a viscosity of 130 poise at 25°C was obtained.

The photocurable composition was prepared in the same manner as described in Example 5, and was cured in the same manner as described in Example 1. The required curing time was 0.3 second.

EXAMPLE 7

38.4 g. (0.1 mole) of the reaction product of polyethyleneglycol diglycidylether and acrylic acid (molar ratio 1 : 2) was dissolved in 100 g. of n-butoxymethylol acrylamide, 0.2 g. of hydroquinone monomethylether, and 17.4 g. (0.08 mole) of pyromellitic acid dianhydride with agitation. Then the mixture was reacted at room temperature for 5 days. A heterogeneous viscous solution was obtained. 20 g. (about 0.4 mole) of a 28% solution of ammonia and 50 ml. of water were added to the mixture. Then the mixture was reacted at from room temperature to 50°C for 8 hours, after which the heterogeneous portion was eliminated, and a quaternary ammonium salt polyester solution was obtained.

The photocurable composition was prepared by adding 5 parts of benzoin-n-butylether to 95 parts of the quaternary ammonium salt solution. The composition was coated on an unglazed plate, was exposed to a 500 W high pressure mercury lamp for 30 seconds, and washed by hot water. The exposed portion was insoluble.

EXAMPLE 8

21 g. (0.04 mole) of the reaction product of bisphenol-A glycidylether and acrylic acid (molar ratio 1 : 2), 3.7 g. (0.06 mole) of ethyleneglycol, and 0.2 g. of hydroquinone monomethylether were dissolved in 100 g. of N-vinylpyrrolidone, and 17.4 g. (0.08 mole) of pyromellitic acid dianhydride was added to the solution with agitation, and the mixture was reacted at from room temperature to 50°C for 8 hours. 50 g. of trimethylolpropane triacrylate was added to the mixture so that the viscosity of the reaction mixture became high, and the mixture was further reacted at room temperature for 1 hour. A polyester solution having a viscosity of 2,300 poise at 25°C was obtained.

The photocurable composition was prepared by adding 2 parts of benzoinethylether to 98 parts of the obtained polyester solution, with curing in the same manner as described in Example 1. The required curing time was 0.3 second.

EXAMPLE 9

1 g. of methyltriethylammonium iodide, 0.05 g. hydroquinone monomethylether, and 0.05 g. of anthraquinone were added to the mixture of 95 g. of epoxy resin DER-331 (bisphenol-A diglycidylether, an epoxy equivalent of 190) and 36 g. (0.5 mole) of acrylic acid, and the mixture was reacted at from 80° to 120°C for 2 hours. Then a solution was prepared by adding 100 g. of stylene and 50 g. of trimethylolpropane triacrylate, and 21.8 g. (0.1 mole) of pyromellitic acid dianhydride was added to the mixture. The mixture was reacted at from 60° to 100°C for 2 hours. A polyester solution having a viscosity of 8.8 poise at 25°C was obtained.

The photocurable composition was prepared by adding to the obtained polyester solution and curing in the same manner as described in Example 1. The curing time was 20 second. The composition was allowed to stand under shielding from light at room temperature and did not gel.

EXAMPLE 10

43.4 g. (0.1 mole) of the reaction product of neopentylglycol diglycidylether and acrylic acid (molar ratio 1 : 2), 17.4 g. (0.08 mole) of pyromellitic acid dianhydride and 0.2 g. (0.08 mole) of hydroquinone monomethylether were added to 200 g. of diethylene glycol diacrylate, and the mixture was reacted at 80°C for 5 hours. A polyester having a viscosity of 520 poise at 25°C was obtained.

The photocurable composition was prepared by adding 2 parts of benzoinethylether to 98 parts of the obtained polyester solution and was allowed to stand under shielding from light at room temperature for 6 months. The composition did not gel. Both viscosity and curing time of the composition, at that time, were almost the same as those shown 6 months previously.

EXAMPLE 11

1 g. of methyltriethylammonium iodide, 0.1 g. of hydroquinone monomethylether, and 0.1 g. of anthraquinone were added to the mixture of 95 g. of epoxy resin DER-331 and 36 g. (0.5 mole) of acrylic acid, with reaction at from 80° to 120°C for 2 hours. 200 g. of methylethylketone was added to the reaction mixture, the temperature of the methylethylketone solution was kept at from 60° to 70°C, and 54.5 g. (0.25 mole) of pyromellitic acid dianhydride was added to the mixture, with the reaction carried out for 5 hours. After the reaction, the methylethylketone solution including about 30 weight % of polyester was prepared by adding 21.4 g. of methylethylketone to the reaction mixture.

The photocurable composition was prepared by adding 1 part of 2-ethyl-anthraquinone to 99 parts of the methylethylketone solution. The composition was coated on the copper plate in a thickness of about 10$\mu$ with a roller coater, and was dried. The negafilm was applied on the dried film, and was exposed to 6X20W chemical lamps from a distance of 30 cm. for 3 minutes, and was developed by methylethylketone. A clear image was obtained on the copper sheet. In case of using 1 weight % of alkaline solution as the developer, a clear image was similarly obtained.

What is claimed is:

1. A photocurable composition comprising: (a) the polyester obtained from pyromellitic acid dianhydride and a polyol selected from the group consisting of a reaction product of polyethylene glycol diglycidyl ether and acrylic acid (molar ratio 1:2), a reaction product of polypropylene glycol diglycidyl ether and acrylic acid (molar ratio 1:2), a reaction product of neopentyl glycol diglycidyl ether and acrylic acid (molar ratio 1:2), a reaction product of bisphenol-A diglycidyl ether and acrylic acid (molar ratio 1:2) and the corresponding methacrylate or crotonate derivatives, and (b) a photopolymerization initiator.

2. A photocurable composition comprising (a) the polyester obtained from pyromellitic acid dianhydride and a polyol selected from the group consisting of a reaction product of polyethylene glycol diglycidyl ether and acrylic acid (molar ratio 1:2), a reaction product of polypropylene glycol diglycidyl ether and acrylic acid (molar ratio 1:2), a reaction product of neopentyl glycol diglycidyl ether and acrylic acid (molar ratio 1:2), a reaction product of bisphenol-A diglycidyl ether and acrylic acid (molar ratio 1:2) and the corresponding methacrylate or crotonate derivative, (b) a photopolymerizable monomer and (c) a photopolymerization initiator.

3. A photocurable composition comprising (a) a quaternary ammonium salt or an alkali metal salt of carboxyl groups in the side chains of the polyester obtained from pyromellitic acid dianhydride and a polyol selected from the group consisting of a reaction product of polyethylene glycol diglycidyl ether and acrylic acid (molar ratio 1:2), a reaction product of polypropylene glycol diglycidyl ether and acrylic acid (molar ratio 1:2), a reaction product of neopentyl glycol diglycidyl ether and acrylic acid (molar ratio 1:2), a reaction product of bisphenol-A diglycidyl ether and acrylic acid (molar ratio 1:2) and the corresponding methacrylate or crotonate derivative, (b) a photopolymerizable monomer and (c) a photopolymerization initiator.

4. A photocurable composition comprising (a) the reaction product of the polyester obtained from pyromellitic acid dianhydride and a polyol selected from the group consisting of a reaction product of polyethylene glycol diglycidyl ether and acrylic acid (molar ratio 1:2), a reaction product of polypropylene glycol diglycidyl ether and acrylic acid (molar ratio 1:2), a reaction product of neopentyl glycol diglycidyl ether and acrylic acid (molar ratio 1:2), a reaction product of bisphenol-A diglycidyl ether and acrylic acid (molar ratio 1:2) and the corresponding methacrylate or crotonate derivative, and a glycidyl ester selected from the group consisting of glycidyl acrylate and glycidyl methacrylate, (b) a photopolymerizable monomer and (c) a photopolymerization initiator.

5. A method of producing a photocurable composition which comprises reacting a polyol selected from the group consisting of a reaction product of polyethylene glycol diglycidyl ether and acrylic acid (molar ratio 1:2), a reaction product of polypropylene glycol diglycidyl ether and acrylic acid (molar ratio 1:2), a reaction product of neopentyl glycol diglycidyl ether and acrylic acid (molar ratio 1:2), a reaction product of bisphenol-A diglycidyl ether and acrylic acid (molar ratio 1:2) and the corresponding methacrylate or crotonate derivative with pyromellitic acid dianhydride in a photopolymerizable monomer, and adding a photopolymerization initiator to the resulting polyester solution.

* * * * *